(12) United States Patent
Roytman et al.

(10) Patent No.: US 9,966,938 B2
(45) Date of Patent: *May 8, 2018

(54) FORWARDED CLOCK JITTER REDUCTION

(71) Applicant: Intel Corporation, Santa Clara, CA (US)

(72) Inventors: Eduard Roytman, Newton Centre, MA (US); Mahalingam Nagarajan, Grafton, MA (US); Pradeep R Vempada, Brighton, MA (US)

(73) Assignee: Intel Corporation, Santa Clara, CA (US)

( * ) Notice: Subject to any disclaimer, the term of this patent is extended or adjusted under 35 U.S.C. 154(b) by 0 days. days.

This patent is subject to a terminal disclaimer.

(21) Appl. No.: 15/094,834

(22) Filed: Apr. 8, 2016

(65) Prior Publication Data

US 2016/0226474 A1 Aug. 4, 2016

Related U.S. Application Data

(63) Continuation of application No. 13/976,877, filed as application No. PCT/US2011/068150 on Dec. 30, 2011, now Pat. No. 9,319,039.

(51) Int. Cl.
| | |
|---|---|
| *H03K 3/017* | (2006.01) |
| *H03K 5/156* | (2006.01) |
| *H03K 5/26* | (2006.01) |
| *H03F 3/45* | (2006.01) |
| *H04L 25/02* | (2006.01) |
| *H04L 25/03* | (2006.01) |

(52) U.S. Cl.
CPC ....... *H03K 5/1565* (2013.01); *H03F 3/45071* (2013.01); *H03K 5/26* (2013.01); *H03F 2200/144* (2013.01); *H03F 2200/165* (2013.01); *H03F 2200/375* (2013.01); *H03F 2200/78* (2013.01); *H04L 25/0274* (2013.01); *H04L 25/0296* (2013.01); *H04L 25/03878* (2013.01)

(58) Field of Classification Search
None
See application file for complete search history.

(56) References Cited

U.S. PATENT DOCUMENTS

| | | | |
|---|---|---|---|
| 4,833,418 A | 5/1989 | Quintus et al. | |
| 7,501,870 B2 | 3/2009 | Choi et al. | |
| 9,319,039 B2 * | 4/2016 | Roytman | H03K 5/26 |
| 2005/0253637 A1 | 11/2005 | Mahadevan et al. | |
| 2007/0075777 A1 | 4/2007 | Kim | |
| 2007/0146011 A1 | 6/2007 | O'Mahony et al. | |

(Continued)

FOREIGN PATENT DOCUMENTS

| | | |
|---|---|---|
| KR | 1020020038047 | 5/2002 |
| KR | 100713016 | 4/2007 |

(Continued)

OTHER PUBLICATIONS

European Search Report for EP Application No. 11878713.4, dated Jun. 9, 2015, 13 pages.

(Continued)

*Primary Examiner* — Cassandra Cox
(74) *Attorney, Agent, or Firm* — Green, Howard & Mughal LLP

(57) ABSTRACT

In some embodiments, a differential amplifier with duty cycle correction is provided.

26 Claims, 3 Drawing Sheets

(56) References Cited

U.S. PATENT DOCUMENTS

| | | |
|---|---|---|
| 2007/0159224 A1 | 7/2007 | Dwarka et al. |
| 2009/0146722 A1 | 6/2009 | Chen et al. |
| 2010/0301913 A1 | 12/2010 | Li et al. |
| 2011/0050307 A1 | 3/2011 | Lin |
| 2012/0086488 A1 | 4/2012 | Willey |

FOREIGN PATENT DOCUMENTS

| | | |
|---|---|---|
| KR | 1020110088380 | 10/2009 |
| WO | 2008009007 | 1/2008 |
| WO | 2008009007 A2 | 1/2008 |
| WO | 2009153211 | 12/2009 |
| WO | 2009153211 A2 | 12/2009 |
| WO | 2010062547 A1 | 6/2010 |
| WO | 2013101200 A1 | 7/2013 |

OTHER PUBLICATIONS

Office Action for Taiwan Patent Application No. 101150506, dated Jul. 24, 2015, 5 pages.
Roytman et al., "Variation tolerant digitally assisted high-speed IO PHY," ESSCIRC (ESSCIRC), 2011 Proceedings of the , vol., No., pp. 163, 166, Sep. 12-16, 2011.
Sawant et al., "A 32 nm Westmere-EX Xeion enterprise processor", Solid-State Circuits Conference Digest of Technical Papers (ISSCC), 2011 IEEE International, Feb. 20-24, 2011, pp. 74-75.
Muljono et al., "A 6.4 GT/s point-to-point unidirectional link with full current compensation", Solid-State Circuits Conference 2009, A-SSCC 2009. IEEE Asian, p. 169-172 (4 pages), Nov. 16-18, 2009.
Taiwan Office Action dated Dec. 19, 2014 for Taiwan Patent Application No. 101150506.
Supplemental European Search Report for EP Application No. 11878713.4, dated Apr. 30, 2015.
Office Action for Chinese Patent Application No. 201320689606.1, dated Mar. 10, 2014, 1 page of Chinese Office Action and 2 pages of English translation.
International Preliminary Report on Patentability received for International Application No. PCT/US2011/068150, dated Jul. 10, 2014, 5 pages.
Office Action for Chinese Patent Application No. 201320689606.1, dated Jul. 14, 2014, 1 page of office action and 1 page of English translation.
International Search Report and Written Opinion received for International Application No. PCT/US2011/068150, dated Sep. 12, 2012, 8 pages.
Office Action for Chinese Patent Application No. 201220748843.6, dated Apr. 26, 2013, 2 pages of Chinese office action and 2 pages of English translation.
Office Action for U.S. Appl. No. 13/976,877, dated Feb. 3, 2014.
Office Action for U.S. Appl. No. 13/976,877, dated Nov. 6, 2014.
Office Action for U.S. Appl. No. 13/976,877, dated Apr. 2, 2015.
Final Office Action for U.S. Appl. No. 13/976,877, dated Sep. 16, 2015.
Notice of Allowance for U.S. Appl. No. 13/976,877, dated Dec. 14, 2015.
Notice of Preliminary Rejection, dated Sep. 20, 2016, for Korean Patent Application No. 10-2016-7021903.
Office Action, dated Sep. 30, 2016, for European Patent Application No. 11878713.4.
Second Office Action dated Jun. 2, 2017 for Taiwan Patent Application No. 105113274.
Extended European Search Report dated Jan. 17, 2017 for EP Patent Application No. EP16189417.5 (Attorney/Client Privileged).
Non-Final Office Action, dated Nov. 22, 2016, for Taiwan Patent Application No. 105113274.

\* cited by examiner

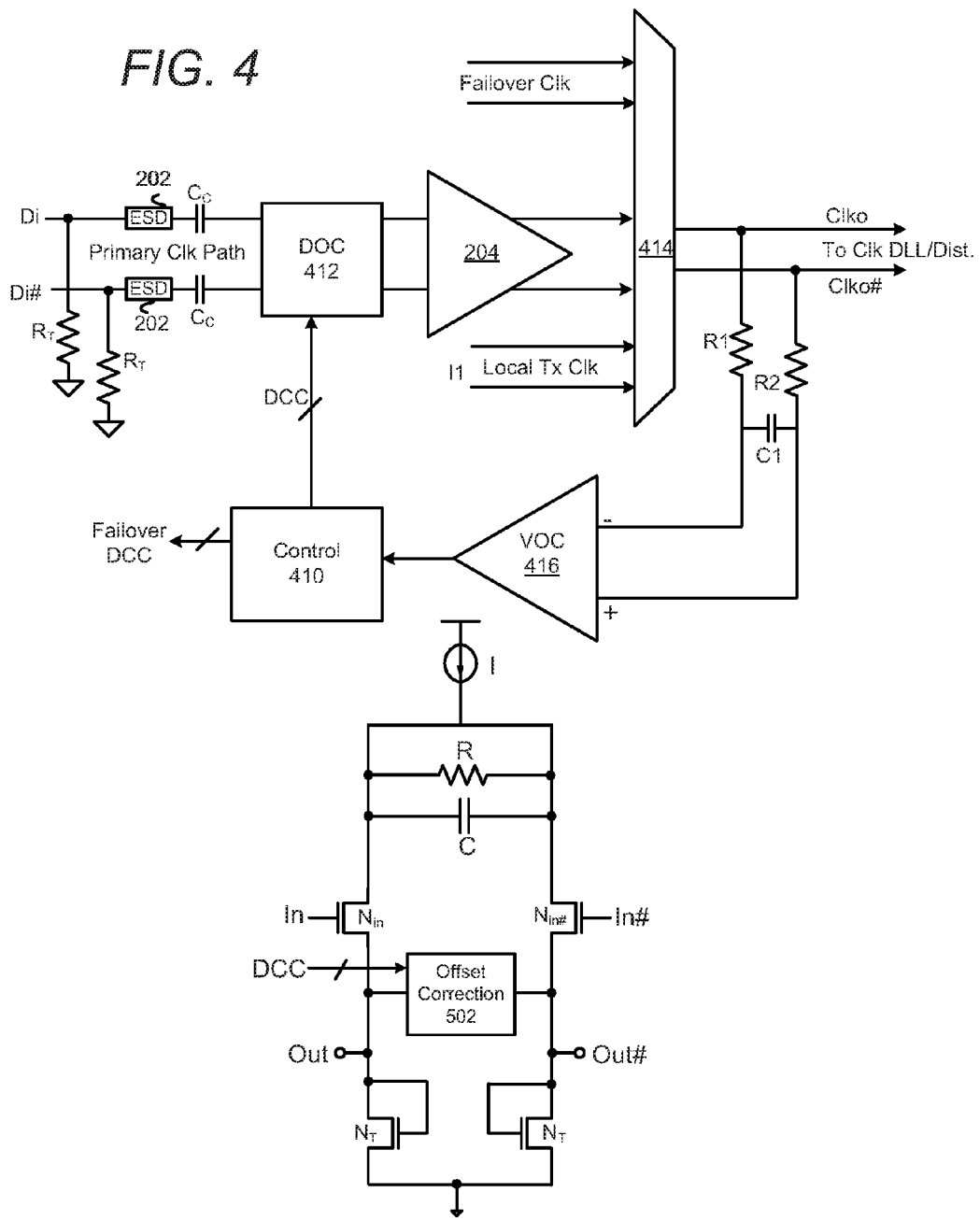

FORWARDED CLOCK JITTER REDUCTION

CLAIM FOR PRIORITY

This application is a continuation of U.S. patent application Ser. No. 13/976,877, filed on 27 Jun. 2013, titled "FORWARDED CLOCK JITTER REDUCTION," which claims priority to PCT Patent Application Serial No. PCT/US11/68150, filed on 30 Dec. 2011, titled "FORWARDED CLOCK JITTER REDUCTION," both of which are incorporated herein by reference in their entirety for all purposes.

TECHNICAL FIELD

The present invention relates generally to an I/O communication link, and in particular, to clock duty cycle control.

BRIEF DESCRIPTION OF THE DRAWINGS

Embodiments of the invention are illustrated by way of example, and not by way of limitation, in the figures of the accompanying drawings in which like reference numerals refer to similar elements.

FIG. 4 shows an embodiment of a clock amplifier circuit with a digital offset compensation feature in accordance with some embodiments.

FIG. 5 is a diagram of a continuous time linear equalizer circuit with offset compensation in accordance with some embodiments.

DETAILED DESCRIPTION

In some embodiments, techniques for controlling duty cycle in a clock receiver are provided. For example, in one embodiment, a clock receiver for a forwarded differential clock is provided with a digital offset compensation loop for controlling (e.g., minimizing) offset in the differential paths in order to control duty cycle for the differential clock signal.

Figure 1:
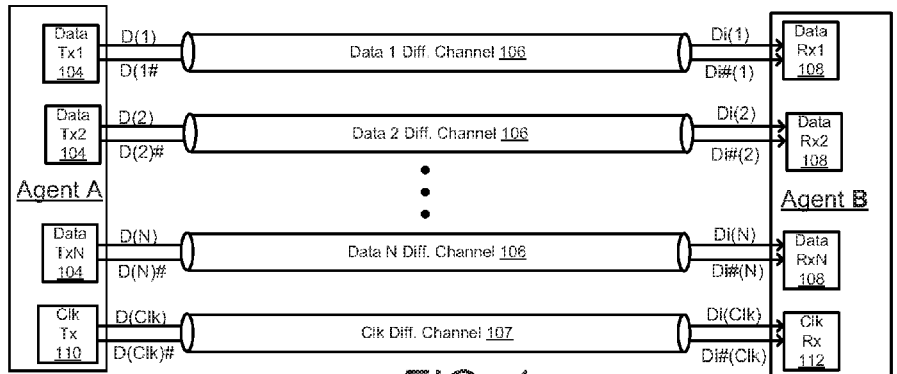
FIG. 1 is a diagram showing one direction of a conventional, forwarded clock link.

FIG. 1 shows one direction of a conventional forwarded clock link. it includes N differential data channels 106, along with a differential clock channel 107 to transmit information from a first agent (Agent A) to a second agent (Agent B). (Note that an agent could be a chip, or a portion of a chip. So, the channels could interconnect two chips or functional blocks within a chip or chip package.)

Figure 3:
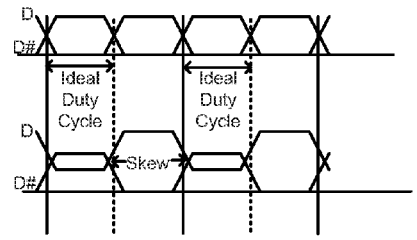
FIG. 3 is a graph showing a differential clock signal to illustrate effects of offset in the signal.

Each data channel has a data transmitter 104 to transmit data to an associated receiver 108 at the other end of the channel. Similarly, the clock channel 107 has a clock transmitter 110 to transmit a clock (a so-called forwarded clock) to a clock receiver 112. FIG. 3 shows a typical differential clock signal, which may be at high frequencies such as in the GHz. or tens of GHz range. At such frequencies, ideal clocks with near flat step characteristics are difficult (if not impossible) to attain. Rather, they may have relatively wide rising and falling slopes, as is depicted in the figure, or even more likely at such high frequencies, they may have sinusoidal characteristics, which also, results in non-instant High-to-Low, or Low-to-High, transitions.

Figure 2:
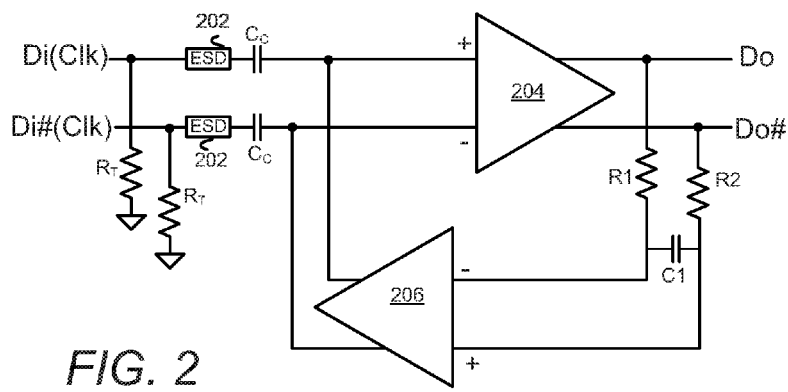
FIG. 2 is a schematic diagram showing a conventional clock amplifier circuit for use in a clock receiver such as in FIG. 1.

FIG. 2 shows a conventional clock amplifier circuit for use in a clock receiver 112. The circuit includes termination resistors (RT), ESD (electro-static discharge) elements 202, coupling capacitors (CC), differential amplifier 204 (which may actually comprise a series of cascaded amplifiers, a low-pass filter formed from resistors R1 and R2 and capacitor C1, and offset cancellation amplifier 206. The amplifier 204 amplifies the incoming clock signal, which may be substantially attenuated (e.g., a 1 V signal may be attenuated down to 100 mV when arriving at the amplifier 204). Another problem with typical channel pathways is that they tend to act like low pass filters, filtering out the higher frequency components. The offset cancellation amplifier 206 functions to remove DC offset from the clock so as to reduce duty cycle jitter. As illustrated in FIG. 3 and appreciated by the Applicants herein, offset, which is typically asymmetrical in the two differential signal lines, causes duty cycle jitter, i.e., skew above or below a desired duty cycle target such as 50% duty cycle.

Unfortunately, with this analog duty-cycle correction approach, it may be difficult to attain good performance with newer processes, e.g., high gains may be difficult to reliably achieve. Moreover, amplifier 206 corrects offset from amplifier 204, but there is nothing to correct offset within the offset correction amplifier 206 itself. Accordingly, new approaches may be desired.

FIG. 4 shows an embodiment of a new clock amplifier circuit with a digital offset correction approach in accordance with some embodiments. The clock amplifier circuit includes a DOC (digital offset compensation) circuit 412 to receive the differential clock signal from AC coupling capacitors (CC). The DOC 412 has a digitally adjustable offset compensation feature to adjust DC offset in the differential signal paths. From here, the differential clock is provided to the differential amplifier 204, which may actually comprise one or more different amplifier stages including a clock amplifier to convert the clock to an acceptable, e.g., CMOS level, signal. In this embodiment, the amplifier 204 provides the clock (primary clock signal) to an input of a multiplexer 414. The multiplexer, as will be addressed further below, may alternatively pass a Failover Clk or a Local Tx Clk signals, which may be used when the primary clock is unavailable. The clock signal at the multiplexer output is provided to downstream clock distribution circuitry, e.g., including to one or more DLL (delay locked loop) circuits, as may generally be known.

The output clock (Clko/Clko#) is fed back through a low-pass filter (formed from R1, R2 and C1) to a variable offset comparator (VOC) 416. Closing the feedback path loop, an over-sampled, control circuit 410 is coupled between the VOC 416 and the CTLE 412. The control circuit 410, in cooperation with the VOC 416, controls the offset compensation feature of the CTLE 412 to adjust the offset of the primary clock signal in order to attain a desired clock duty cycle at the output.

The DOC 412 provides an amplifier front-end, e.g., with high sensitivity, and an ability to digitally correct (or adjust) offset in the primary clock path, and thus, to adjust the duty-cycle of the incoming clock signal. In some embodiments, it may also incorporate high-pass filter functionality, thereby compensating (or at least attempting to compensate) for the inherent low-pass characteristics of the lossy channel.

For example, it could be implemented with a CTLE (continuous time linear equalizer) circuit.

Figure 6:
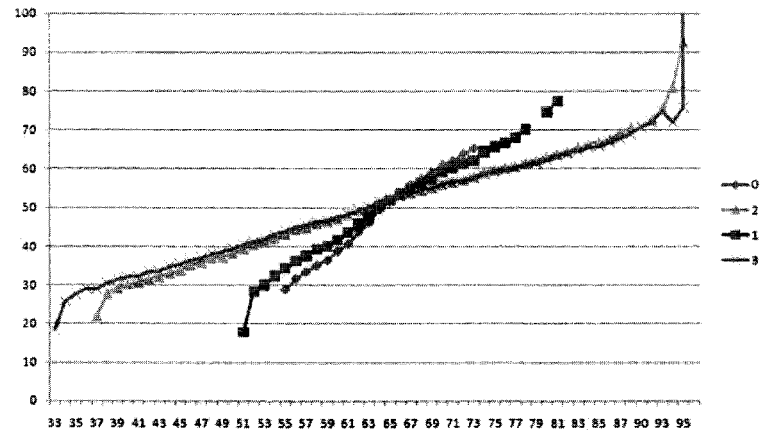
FIG. 6 is a graph showing an open loop response for a clock signal duty cycle as a function of digital control values over four different ranges in accordance with some embodiments.

With additional reference to FIG. 5, an exemplary CTLE/offset compensation circuit is shown. In this simplified example, the CTLE comprises a conventional high-pass differential amplifier with an offset compensation circuit 502. The offset compensation circuit 502 could comprise, for example, a current steering DAC for injecting or sinking current into/from the differential paths (Out, Out#) to adjust the DC offset of the paths, and thus, the offset of the differential clock in the clock amplifier of FIG. 4. The amount, and direction, of offset adjustment is dictated by a digital correction code (DCC) word provided to the offset compensation circuit 502 from the control circuit 410. For example, in one embodiment, the DCC is a 7 bit word that can control offset correction values over multiple (e.g., 4) ranges of sensitivity. (For example, the 2 most significant bits could define four adjustment ranges.) Of course, the particular manner in which the offset is controlled by the DCC value could be done in any suitable manner such as through the adjustment of current source strengths or through the enabling/disabling of drivers, e.g., used in a DAC. FIG. 6 shows an open loop response for primary path duty cycle values (Y-axis) as a function of DCC values (X-axis) over four different ranges (or four different sensitivity settings).

Returning to FIG. 4, the VOC 416 may be implemented with any suitable comparator. Ideally, it will be implemented with a comparator having the capability of removing its inherent offset, and thereby, not introducing additional, problematic offset error into the primary clock loop. it compares the low-pass filtered (integrated) version of the differential output clock, against a threshold to indicate if the duty cycle of the clock is below or above a duty cycle target (e.g., 50% duty cycle). Thus, if the clock duty cycle is hovering around the threshold (e.g., 50% duty cycle), the output of the VOC will vacillate between its High and Low (e.g., '1 and '0) output values, but if the clock duty cycle is substantially above or below the threshold, then the VOC will output a relatively continuous logical output, either a '1 or a '0, depending on the direction of the duty cycle error. In some embodiments, the VOC and DOC may use the same, or similar, offset correction approaches, e.g., a differential amp. with an adjustable current steering DAC coupled to its output paths. Both may be used for offset correction, while the DOC may further use it to adjust duty cycle.

The control circuit 410 may be implemented as a finite state machine (FSM) or with any other suitable logic methodology. It may essentially function as an over-sampled low-pass digital filter. In fact, in some embodiments, it comprises a counter to be incremented or decremented, depending on the digital ('1 or '0) output from VOC 416. The control circuit 410 may be clocked using a relatively slow clock, as compared with the frequency of the primary clock itself. For example, the primary clock could be about 9 GHz, while the DCC circuit 410 might be clocked in the tens or hundreds of MHz range. It may comprise additional logic to implement the different sensitivity ranges, if available. This could be as simple as one or more of the significant bits from the DCC word used to control the engagement of course circuit components for the offset compensation circuit in the DOC 412.

In some embodiments, the DOC has 4 "strength" ranges, from smallest to largest. The stronger the setting, the wider range of duty-cycle can be adjusted. The smaller the setting the smaller range that duty-cycles can be adjusted, but the smaller the strength setting the finer the granularity it is between each setting. In some implementations, during initialization, the control circuit may start using a smallest strength setting and if it can fix the duty-cycle in that setting with sufficient margin, it stays there. Otherwise, it jumps to, and tries to converge using a next larger strength range, and so on.

The control logic 410 may be substantially autonomous, or it may be controllable by a separate controller, e.g., for implementing one or more different modes. With the offset compensation feature of the CTLE, it can be used to shape the primary clock by adjusting its duty cycle to almost any desired value, for whatever purpose. As addressed in the following section, it may also provide a clock failover DCC signal for controlling an offset compensation or CTLE circuit in a data receiver when it is used to generate the primary clock instead of the forwarded clock receiver.

Figure 7:
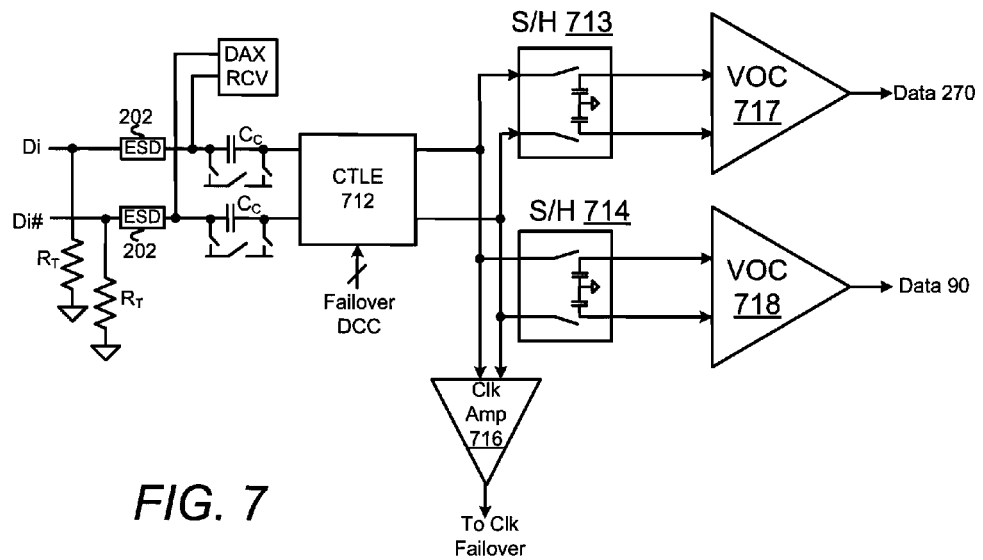
FIG. 7 is a diagram showing a data lane (channel) receiver that may be used to generate a clock in a clock-failover mode in accordance with some embodiments.

FIG. 7 shows a data lane (channel) receiver that may be used to generate the primary clock in a clock-failover mode. For example, in some failover modes, when the forwarded clock is not available, for whatever, reason, the system may re-configure itself to instead send the clock over one of the data lanes in order to sustain operability.

The data receiver of FIG. 7 has a similar front end as the clock receiver, except that as a receiver whose primary function is to receive data, it has switchably engageable DC coupling capability for providing a received differential data signal from the ESD elements to its CTLE 712. In the depicted embodiment, however, it also includes coupling capacitors (CC) that may be switched in place of the DC coupling lines when used for the clock in the failover mode.

Data receiver circuits typically include a CTLE, as is the case here with CTLE 712. From here, pertinent to its data receiver functionality, the receiver has sample/hold circuits 713, 714 and VOCs 717, 718, for providing double-pumped, 180 degree out-of-phase data signals Data 270 and Data 90. However, with pertinence to the clock failover functionality, the receiver circuit also includes a clock amp. 716 tapped off of the differential path after the CTLE 712. The output from the clock amp. is provided back into the clock receiver circuit (FIG. 4) so that it may be controlled with a compensated duty cycle as discussed above. In the depicted embodiment, the clock Amp. output is provided to the Failover Clk input of the multiplexer 414. At the same time, the Failover DCC signal from the control logic 410 (FIG. 4) is coupled to the CTLE 712 to close the duty cycle control loop for clock failover mode.

So, with this implementation, the DCC word is sent into the data-lane CTLE for duty-cycle correction right at the source (near the failover clock pads) to reduce any jitter amplification downstream. Also, in the depicted embodiment, the clock may be restored to "full-rail" by the Clk Amp 716, before being sent to multiplexer 414.

(Note that in this embodiment, the CTLE 712 has an offset compensation feature so that the control logic 410 can control its offset, and thus, its duty cycle. It should be appreciated that in other embodiments, an offset control might be implemented in a different block or circuit. Along these lines, in some embodiments, a CTLE may not even be used, e.g., a different type of filter, or no filter at all, might be employed.)

In the preceding description, numerous specific details have been set forth. However, it is understood that embodiments of the invention may be practiced without these specific details. In other instances, well-known circuits, structures and techniques may have not been shown in detail in order not to obscure an understanding of the description. With this in mind, references to "one embodiment", "an embodiment", "example embodiment", "various embodiments", etc., indicate that the embodiment(s) of the invention so described may include particular features, structures, or characteristics, but not every embodiment necessarily includes the particular features, structures, or characteristics. Further, some embodiments may have some, all, or none of the features described for other embodiments.

In the preceding description and following claims, the following terms should be construed as follows: The terms "coupled" and "connected," along with their derivatives, may be used. It should be understood that these terms are not intended as synonyms for each other. Rather, in particular embodiments, "connected" is used to indicate that two or more elements are in direct physical or electrical contact with each other. "Coupled" is used to indicate that two or more elements co-operate or interact with each other, but they may or may not be in direct physical or electrical contact.

The term "PMOS transistor" refers to a P-type metal oxide semiconductor field effect transistor. Likewise, "NMOS transistor" refers to an N-type metal oxide semiconductor field effect transistor. It should be appreciated that whenever the terms: "MOS transistor", "NMOS transistor", or "PMOS transistor" are used, unless otherwise expressly indicated or dictated by the nature of their use, they are being used in an exemplary manner. They encompass the different varieties of MOS devices including devices with different VTs, material types, insulator thicknesses, gate(s) configurations, to mention just a few. Moreover, unless specifically referred to as MOS or the like, the term transistor can include other suitable transistor types, e.g., junction-field-effect transistors, bipolar-junction transistors, metal semiconductor FETs, and various types of three dimensional transistors, MOS or otherwise, known today or not yet developed.

The invention is not limited to the embodiments described, but can be practiced with modification and alteration within the spirit and scope of the appended claims. For example, it should be appreciated that the present invention is applicable for use with all types of semiconductor integrated circuit ("IC") chips. Examples of these IC chips include but are not limited to processors, controllers, chip set components, programmable logic arrays (PLA), memory chips, network chips, and the like.

It should also be appreciated that in some of the drawings, signal conductor lines are represented with lines. Some may be thicker, to indicate more constituent signal paths, have a number label, to indicate a number of constituent signal paths, and/or have arrows at one or more ends, to indicate primary information flow direction. This, however, should not be construed in a limiting manner. Rather, such added detail may be used in connection with one or more exemplary embodiments to facilitate easier understanding of a circuit. Any represented signal lines, whether or not having additional information, may actually comprise one or more signals that may travel in multiple directions and may be implemented with any suitable type of signal scheme, e.g., digital or analog lines implemented with differential pairs, optical fiber lines, and/or single-ended lines.

It should be appreciated that example sizes/models/values/ranges may have been given, although the present invention is not limited to the same. As manufacturing techniques (e.g., photolithography) mature over time, it is expected that devices of smaller size could be manufactured. In addition, well known power/ground connections to IC chips and other components may or may not be shown within the FIGS., for simplicity of illustration and discussion, and so as not to obscure the invention. Further, arrangements may be shown in block diagram form in order to avoid obscuring the invention, and also in view of the fact that specifics with respect to implementation of such block diagram arrangements are highly dependent upon the platform within which the present invention is to be implemented, i.e., such specifics should be well within purview of one skilled in the art. Where specific details (e.g., circuits) are set forth in order to describe example embodiments of the invention, it should be apparent to one skilled in the art that the invention can be practiced without, or with variation of, these specific details. The description is thus to be regarded as illustrative instead of limiting.

What is claimed is:

1. An apparatus comprising:
   a first input node;
   a first termination resistor coupled to the first input node and a reference node;
   a second input node;
   a second termination resistor coupled to the second input node and the reference node;
   a first amplifier to receive first and second signals from the first and second input nodes, respectively;
   a second amplifier coupled to the first amplifier, the second amplifier to receive a differential output of the first amplifier and to provide an amplified output; and
   a digital offset cancellation circuit coupled to a node providing the amplified output from the second amplifier and also coupled to the first amplifier, wherein the first amplifier, the second amplifier, and the digital offset cancellation circuit are part of a receiver.

2. The apparatus of claim 1, wherein the digital offset cancellation circuit is operable to compensate for offset in the first amplifier.

3. The apparatus of claim 1, wherein the first amplifier has a sensitivity which is high enough to detect the first and second signals in a giga-Hertz range.

4. The apparatus of claim 1, wherein the first and second signals together form a differential signal.

5. A system comprising:
   a transmitter to transmit a differential signal;
   a transmission media coupled to the transmitter; and
   a receiver to receive the differential signal over the transmission media, the receiver including:
   a first input node;
   a first termination resistor coupled to the first input node and a reference node;
   a second input node;
   a second termination resistor coupled to the second input node and the reference node;
   a first amplifier to receive the differential signal from the first and second input nodes, respectively;
   a second amplifier coupled to the first amplifier, the second amplifier to receive a differential output of the first amplifier and to provide an amplified output; and
   a digital offset cancellation circuit coupled to a node providing the amplified output from the second amplifier and also coupled to the first amplifier.

6. The system of claim 5, wherein the digital offset cancellation circuit is operable to compensate for offset in the first amplifier.

7. The system of claim 5, wherein the first amplifier has a sensitivity which is high enough to detect the differential signal in a giga-Hertz range.

8. An apparatus comprising:
means for receiving a differential signal;
means for providing termination impedance to the means for receiving the differential signal;
means for amplifying the differential signal; and
means for digitally cancelling offset associated with the means for amplifying the differential signal; and
wherein the means for digitally cancelling offset is coupled to a node of the means for amplifying the differential signal and also coupled to the means for receiving the differential signal, wherein the means for receiving, the means for amplifying, the means for digitally canceling offset are part of a receiver.

9. The apparatus of claim 8, wherein the means for amplifying has a sensitivity which is high enough to detect the differential signal in a giga-Hertz range.

10. A method comprising:
receiving a differential signal;
providing termination impedance to the differential signal;
amplifying the differential signal; and
digitally cancelling offset associated with means for amplifying the differential signal, and
wherein the means for digitally cancelling offset is coupled to a node of the means for amplifying the differential signal and also coupled to means for receiving the differential signal,
wherein the method of receiving, providing, amplifying, and digitally cancelling offset are performed in a receiver.

11. The method of claim 10, wherein amplifying the differential signal is performed by an amplifier which has a sensitivity which is high enough to detect the differential signal in a giga-Hertz range.

12. A chip, comprising:
a differential amplifier having an input to receive a differential signal and an output to provide an output signal; and
an offset adjustment circuit coupled between the input and output, wherein the offset adjustment circuit includes:
a variable offset comparator (VOC),
a differential offset compensation (DOC) circuit having an output coupled to the input of the differential amplifier, and
a control circuit coupled between the VOC and DOC.

13. The chip of claim 12, wherein the offset compensation circuit is disposed between the differential amplifier and electrical contacts for receiving the differential signal from off of the chip.

14. The chip of claim 12, wherein the offset compensation circuit is part of an active filter circuit.

15. The chip of claim 14, wherein the active filter circuit implements a continuous time linear equalizer circuit.

16. The chip of claim 12, wherein the VOC is to receive a low-pass filtered version of the differential signal to generate a digital value representing whether or not a duty cycle of the differential signal is above or below a threshold.

17. The chip of claim 12 comprises a switch to receive a failover clock to be used as the differential signal.

18. The chip of claim 12, wherein the offset compensation circuit is disposed between the differential amplifier and electrical contacts for receiving the differential signal from off of the chip.

19. The chip of claim 12, wherein the offset compensation circuit is part of an active filter circuit.

20. The chip of claim 14, wherein the active filter circuit implements a continuous time linear equalizer circuit.

21. The chip of claim 12, wherein the VOC is to receive a low-pass filtered version of the differential signal to generate a digital value representing whether or not a duty cycle of the differential signal is above or below a threshold.

22. The chip of claim 12 comprises a switch to receive a failover clock to be used as the differential signal.

23. The apparatus of claim 1, wherein the digital offset cancellation circuit is a differential offset cancellation circuit.

24. The apparatus of claim 1, wherein the digital offset cancellation circuit is controllable.

25. The apparatus of claim 1, wherein the second amplifier comprises a variable offset comparator (VOC).

26. The apparatus of claim 1, wherein the digital offset cancellation circuit is controllable by a control circuit to digitally control a DC offset.

* * * * *